US008123981B2

(12) United States Patent
Miyagawa et al.

(10) Patent No.: US 8,123,981 B2
(45) Date of Patent: Feb. 28, 2012

(54) METHOD OF FABRICATING TRANSLUCENT PHOSPHOR CERAMICS

(75) Inventors: Hiroaki Miyagawa, Oceanside, CA (US); Toshitaka Nakamura, Oceanside, CA (US); Hironaka Fujii, Carlsbad, CA (US); Amane Mochizuki, San Diego, CA (US)

(73) Assignee: Nitto Denko Corporation, Osaka (JP)

( * ) Notice: Subject to any disclaimer, the term of this patent is extended or adjusted under 35 U.S.C. 154(b) by 459 days.

(21) Appl. No.: 12/389,177

(22) Filed: Feb. 19, 2009

(65) Prior Publication Data
US 2010/0207512 A1 Aug. 19, 2010

(51) Int. Cl.
C09K 11/08 (2006.01)
C09K 11/80 (2006.01)

(52) U.S. Cl. .......... 252/301.4 R; 501/152; 501/153; 252/301.4 S; 252/301.4 H; 252/301.4 F; 252/301.4 P; 252/301.5; 252/301.6 R; 252/301.6 S; 252/301.6 F; 252/301.6 P

(58) Field of Classification Search .......... 501/152, 501/153; 252/301.4 R–301.6 P; 313/503, 313/486; 257/98
See application file for complete search history.

(56) References Cited

U.S. PATENT DOCUMENTS

| | | | |
|---|---|---|---|
| 5,625,256 A | 4/1997 | Tiedt et al. | |
| 5,998,925 A | 12/1999 | Shimizu et al. | |
| 6,059,936 A | 5/2000 | Cathey et al. | |
| 6,069,440 A | 5/2000 | Shimizu et al. | |
| 6,180,029 B1 | 1/2001 | Hampden-Smith et al. | |
| 6,482,387 B1 | 11/2002 | Gulgun et al. | |
| 6,630,691 B1 | 10/2003 | Mueller-Mach et al. | |
| 6,706,212 B2 | 3/2004 | Venkataramani et al. | |
| 6,844,285 B1 | 1/2005 | Wei | |
| 7,126,274 B2 | 10/2006 | Shimizu et al. | |
| 7,253,129 B2 | 8/2007 | Takagimi et al. | |
| 7,361,938 B2 | 4/2008 | Mueller et al. | |
| 2003/0102288 A1 | 6/2003 | Lu et al. | |
| 2004/0167010 A1 | 8/2004 | Sato et al. | |
| 2005/0269582 A1 | 12/2005 | Mueller et al. | |
| 2007/0010035 A1 | 1/2007 | Liu et al. | |
| 2007/0182037 A1 | 8/2007 | Rabinovitch et al. | |

(Continued)

FOREIGN PATENT DOCUMENTS
JP 2-209987 8/1990
(Continued)

OTHER PUBLICATIONS

Chiang, et al, "Luminescent Properties of Cerium-Activated Garnet Series Phosphor: Structure and Temperature Effects", Journal Electrochemical Society. vol. 155 (6) B517-B520(2008).

(Continued)

Primary Examiner — Carol M Koslow
(74) Attorney, Agent, or Firm — Knobbe, Martens, Olson & Bear, LLP

(57) ABSTRACT

One embodiment provides a method for fabricating a translucent phosphor ceramic compact comprising: heating a precursor powder to at least about 1000° C. under a reducing atmosphere to provide a pre-conditioned powder, forming an intermediate compact comprising the pre-conditioned powder and a flux material, and heating the intermediate compact under a vacuum to a temperature of at least about 1400° C. In another embodiment, the compact may be a cerium doped translucent phosphor ceramic compact comprising yttrium, aluminum, oxygen, and cerium sources. Another embodiment may be a light emitting device having the phosphor translucent ceramic provided as described herein.

21 Claims, 5 Drawing Sheets

U.S. PATENT DOCUMENTS

2008/0108496 A1      5/2008    Gratson et al.

FOREIGN PATENT DOCUMENTS

| | | | |
|---|---|---|---|
| JP | 2008-010791 | | 1/2008 |
| WO | WO 2007/107896 A1 | | 9/2007 |
| WO | WO 2007/107915 A1 | | 9/2007 |
| WO | WO 2007/107917 A2 | | 9/2007 |
| WO | WO 2009/083887 | * | 7/2009 |

OTHER PUBLICATIONS

R. Kasuya et al., "Characteristic optical properties of transparent color conversion film prepared from YAG:Ce3+ nanoparticles," Applied Physics Leters, 91, 111916 (2007).

Jianren Lu et al., "Neodymium doped yttrium aluminium garget (Y3AI5O12) nanocrystalline ceramics—a new generation of solid state laser and optical materials," Journal of Alloys and Compounds 341 (2002) 220-225.

Nyman, et al., "Comparison of Solid-State and Spray-Pyrolysis Synthesis of Yttrium Aluminate Powders", Journal of the American Ceramic Society, 80(5): 1231-1238 (1997).

Hideki Yagi et al., "Characterizations and laser performances of highly transparent Nd3+:Y3AI5O12 laser ceramics," Optical Materials 29 (2007) 1258-1262.

Yen, et al., "Inorganic Phosphors: Compositions, Preparation and Optical Properties", CRC press (2004). Sections 1, 2, and 6 only.

Chaim, R., et al., "Transparent yttrium aluminum garnet (YAG) ceramics by spark plasma sintering", J. Eur. Ceramic Soc., 27(2007):3331-3337.

Ramanathan, S., et al, "Transparent YAG from powder prepared by homogeneous precipitation reaction-AI(NO3)3 + Y(NO3)3 + (NH4)2SO4 + CO(NH2)2", J Materials Sci. Letters 20 (2001):2119-2121.

Ryu, J.H. et al., Luminescent Properties of Ca-a-SiAION:Eu2+ Phosphors Synthesized by Gas-Pressured Sintering, Journal of The Electrochemical Society, 155(4), J99-J104 (2008), Pages.

* cited by examiner

METHOD OF FABRICATING TRANSLUCENT PHOSPHOR CERAMICS

BACKGROUND

1. Field of the Invention

This invention relates to light emitting devices, such as light emitting devices comprising phosphor translucent ceramics.

2. Description of the Related Art

White light-emitting devices may be fabricated using a combination of a blue light-emitting diode (LED) and a phosphor material. These devices are often configured so that the blue light from the blue light-emitting diode comes in contact with the phosphor material so that the phosphor material may absorb a portion of the blue light and emit light that is of a longer wavelength. As a result, these materials have been described as wavelength converting or color changing materials. This allows the device to emit a combination of light that appears more white. There are two common methods for doing so. First, the phosphor particles may be dispersed in another solid component, for example, an encapsulent resin, through which the light passes, thus coming into contact with the dispersed phosphor particles. Second, the phosphor material may be in the form of a phosphor ceramic compact, in which case the blue light would pass through the compact.

The disadvantage of the phosphor particles is that particles that are large enough to be emissive have a tendency to scatter the light, thus reducing the white light emission of the device. On the other hand, the phosphor ceramic compacts are generally prepared by annealing of the phosphor powder and subsequent sintering of the compact, which condition can affect the luminescent efficiency of the phosphor ceramic. Luminescence efficiency can be improved by annealing the phosphor ceramic compacts under a reducing atmosphere, but that tends to make the compacts more opaque, thus reducing the utility of the light-emitting device. Thus, there is a need for a translucent phosphor ceramic compact with improved luminescence.

SUMMARY OF THE INVENTION

One embodiment provides a method for fabricating a cerium doped translucent phosphor ceramic compact comprising heating a precursor powder comprising yttrium, aluminum, oxygen, and cerium sources to a temperature of from about 1000° C. to about 1350° C. under a reducing atmosphere to provide a pre-conditioned powder; forming an intermediate compact comprising the pre-conditioned powder and a flux material; and heating the intermediate compact under a vacuum at a temperature of from about 1400° C. to about 1800° C.

Another embodiment provides a method for fabricating a translucent phosphor ceramic compact comprising: heating a precursor powder to at least about 1000° C. under a reducing atmosphere to provide a pre-conditioned powder; forming an intermediate compact comprising the pre-conditioned powder and a flux material; and heating the intermediate compact under a under a vacuum to a temperature of at least about 1400° C.

Another embodiment provides a light emitting device having the phosphor translucent ceramic provided as described herein.

DETAILED DESCRIPTION OF EMBODIMENTS

Figure 1:
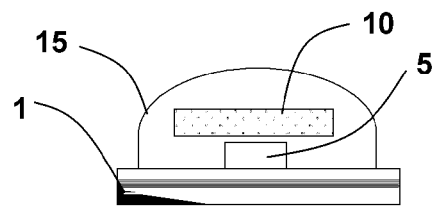
FIG. 1 is a schematic diagram of one example of a device comprising a phosphor translucent ceramic compact disclosed herein.

One embodiment provides a method of preparing a translucent phosphor ceramic compact that has both high luminous efficiency and high transparency. The method comprises heating a precursor powder to at least about 1000° C. under a reducing atmosphere to provide a pre-conditioned powder, forming an intermediate compact comprising the pre-conditioned powder and a flux material, and heating the intermediate compact under a vacuum to a temperature of at least about 1400° C. A "translucent phosphor ceramic compact" may be a ceramic object that is translucent and comprises a plurality of ceramic particles, wherein at least a portion of the plurality of ceramic particles have sufficiently adhered to one another to form a single piece object.

In some embodiments, the translucent phosphor ceramic compact, the intermediate compact, the precursor powder, or the pre-conditioned powder may comprise $(A_{1-x}E_x)_3B_5O_{12}$, wherein A is Y, Gd, La, Lu, Tb, or a combination thereof, B is Al, Ga, In, or a combination thereof, and E is Ce, Eu, Tb, Nd, or a combination thereof The value of x may be from about 0.00005 to about 0.1, from about 0.0001 to about 0.01, or alternatively from about 0.001 to about 0.005. In some embodiments, A is Y; E is Ce; B is Al; and x is from about 0.00005 to about 0.1, from about 0.0001 to about 0.01, about 0.001 to about 0.005, or about 0.002.

In some embodiments, the translucent phosphor ceramic compact, the intermediate compact, the precursor powder, or the pre-conditioned powder may comprise a phosphor material having garnet structure, such as yttrium aluminium garnet (YAG) particles, or a rare earth doped phosphor material having garnet structure, such as YAG:Ce powder. In some embodiments, the phosphor material may comprise cerium, yttrium, aluminum, and oxygen, wherein the cerium to yttrium molar ratio is from about 0.002 to about 0.02, from about 0.00025 to about 0.0065, from about 0.0014 to about 0.007, or alternatively, from about 0.0014 to about 0.003.

In some embodiments, a precursor powder may comprise a mixture of metallic oxides, which may be converted to a ceramic material by a heating In some embodiments, the precursor powder may comprise yttrium aluminium monocyclic (YAM), yttrium aluminium perovskite (YAP), amorphous yttrium aluminum oxide, or a combination of one or more of these. If a YAG:Ce translucent ceramic compact is sought, a precursor powder comprising YAG:Ce powder, Y—Al—O—Ce containing amorphous powder, mixtures of YAlO$_3$:Ce and Al$_2$O$_3$ powders, mixtures of Y$_2$O$_3$, Al$_2$O$_3$, and CeO$_2$ powders, and any combination thereof, may be used.

Precursor powders such as these might be prepared by dissolving yttrium nitrate, aluminium nitrate, and cerium (III) nitrate, or hydrates thereof, in water and introducing the solution to a RF plasma chamber.

A precursor powder may be heated under a reducing atmosphere to provide a pre-conditioned powder of the desired YAG phase. In one embodiment, the preferred size of the resultant pre-conditioned powder for molding into a compact and subsequent sintering is between about 50 nm and about 500 nm. In another embodiment, the preferred size range for the pre-conditioned powder is between about 75 nm and about 300 nm. In another embodiment, the preferred size for the pre-conditioned power is about 100 nm to about 150 nm.

Heating under a reducing atmosphere may occur at any temperature of about 1000° C. or higher, but below the sintering temperature of the ceramic processing step. For example, in some embodiments, the precursor powder such as YAG, YAP, YAM or amorphous yttrium aluminum oxide is heated at a temperature above about 1000° C. but below 1450° C. In some embodiments, the precursor powders are heated to a temperature from about 1000° C. to about 1400° C., about 1100° C. to about 1300° C., or from about 1150° C. to about 1250° C.

While not intending to be limiting, under some circumstances the heating temperature may be related to the original particle size. For example, in some embodiments, where the precursor powder particle size is about 75 nm or smaller, it is desired that the particle size of these smaller particles be controlled or altered to the preferred particle size described above in addition to converting the phase of the material to the preferred YAG phase. For these smaller particles, such as those at about 1 nm to about 75 nm in diameter, a higher temperature (e.g. about 1200-about 1350° C.) and longer heating time period may be desirable to achieve the desired particle size described above.

In other embodiments, for larger particles closer to the preferred particle size, e.g., about 100-300 nm in diameter, a lower temperature (e.g. about 1000 to about 1200° C.) than that applied to smaller particles may be desirable. In some embodiments, the temperature is at least about 1000° C., at least about 1050° C., at least about 1100° C., at least about 1150° C., or least about 1200° C. and may be up to about 1350° C., up to about 1300° C., or up to about 1250° C. Heating may occur for any length of time depending upon the circumstances. In some embodiments, heating occurs for at least about 0.1 hours or at least about 1 hour and may occur for up to about 5 hours or up to about 10 hours.

In some embodiments, a reducing atmosphere may be an atmosphere that has a greater tendency to reduce a composition as compared to air. Examples of reducing atmospheres may include atmospheres comprising reducing gases such as hydrogen gas, ammonia, hydrazine, carbon monoxide, incomplete carbon combustion products, etc., and a mixture thereof Any reducing gas may also be diluted in an inert gas such as nitrogen, helium, neon, argon, krypton, xenon, etc., and a mixture thereof, to provide a reducing atmosphere. For example a reducing atmosphere may comprise a mixture of nitrogen and hydrogen, or a mixture of argon and hydrogen. In some embodiments, the reducing atmosphere may comprise hydrogen gas ($H_2$) at a concentration of about 1% to about 10%, about 1% to about 5%, about 2% to about 4%, or about 3% by volume in nitrogen or argon. The atmosphere may consist essentially of hydrogen in these concentration ranges diluted in argon or nitrogen. In some embodiments, heating occurs under a reducing atmosphere comprising about 3% (v/v) $H_2$ and about 97% (v/v) $N_2$ at about 1200° C. for about 2 hrs. In some embodiments, the reducing atmosphere comprises a mixture of at least one inert gas and hydrogen gas.

In some embodiments, prior to heating the plurality of precursor powders or particles under reducing atmosphere, the precursor powders may also be heated under air or ambient atmosphere at about 1000° C. to about 1350° C.

Next, an intermediate compact comprising a pre-conditioned powder (provided by heating a precursor powder under a reducing atmosphere) and a flux material is formed. In some embodiments, the flux material may be a substance that increases the crystallinity of a phosphor. Examples of flux materials include, but are not limited to, alkali metal halides such as NaCl or KCl, silicon-containing materials, such as silica, magnesium containing materials such as $SiO_2$ or MgO, and tetraethyl orthosilicate, and organic compounds such as urea.

An intermediate compact may be formed by any suitable means. For example, an intermediate compact may be formed by molding or shaping a mixture of the pre-conditioned powders and the flux material into a desired shape. In some embodiments, a simple die, hot isostatic pressing (HIP), cold isostatic pressing (CIP), and other methods may be utilized for molding. In other embodiments, controlled quantities of a mixture are loaded in a mold followed by applying pressure. While not intending to be limiting, a process of loading controlled quantities of a mixture followed by applying pressure may help to control the thickness of a phosphor translucent ceramics layer. In some embodiments, the applied pressure is about 18 to about 370 MPa, about 150 to about 220 MPa, about 170 to about 190 MPa or about 180 MPa.

In some embodiments, the intermediate compact may comprise additional material such as a binder, a dispersant, and/or a solvent to aid the mixing and molding processes. A binder may be any substance that improves adhesion of the particles of the composition being heated to form a ceramic solid. Some non-limiting examples of binders include polymers such as polyvinyl alcohol, polyvinyl acetate, polyvinyl chloride, polyvinyl butyral and polystyrene, polyethylene glycol, polyvinylpyrrolidones, polyvinyl acetates, polyvinyl butyrates, Poly(vinyl butyral-co-vinyl alcohol-co-vinyl acetate), polyvinylacetate (PVA), etc. In some, but not all circumstances, it may be useful for a binder to be sufficiently volatile that it is completely removed from the when the intermediate compact is heated under vacuum. Some non-limiting examples of solvents include organic solvents, including $C_1$-$C_4$ alcohols, such as methanol, ethanol, etc.

In some embodiments, a combination of a pre-conditioned powder comprising YAG particles, poly(vinyl butyral-co vinyl alcohol-co vinyl acetate), and fumed silica nanoparticles are mixed and compressed to provide the intermediate compact.

An intermediate compact provided by molding a mixture of pre-conditioned powders and the flux material can then be heated under a vacuum at any temperature of about 1400° C. or higher to form the translucent phosphor ceramic compact. In some embodiments, as the intermediate compact may be heated to a temperature of at least about 1450° C. or at least about 1500° C., and up to about 1650° C., about 1700° C., about 1800° C., or about 1900° C. In some embodiments, the intermediate compact is heated or sintered under vacuum at between about 1450° C. to about 1900° C. In some embodiments, the intermediate compact is heated or sintered under vacuum at between about 1600° C. to about 1800° C. In some embodiments, the temperature may be chosen based upon the original particle size as described earlier. For example, for some embodiments with smaller particles, e.g., less than the preferred particle size, such as those at about 1 nm to about 75 nm in diameter, a higher temperature (e.g. about 1600 to about 1900° C.) and longer heating time may be desirable. For some embodiments with larger particles closer to about 100-300 nm in diameter, a lower temperature (e.g. about 1400 to about 1600° C.) may be desirable. In some embodiments, the intermediate compact is heated to a temperature from about 1400° C. to about 1900° C., from about 1400° C. to about 1800° C., or from about 1500° C. to about 1700° C.

The heating under a vacuum may occur for any length of time depending upon the circumstances. In some embodiments, heating may occur for at least about 0.1 hours, about 1 hour, about 3 hours and may occur for up to about 7 hours, about 10 hours, or 20 hours. In other embodiments, an yttrium aluminum garnet (YAG) plate may be heated at about 1500° C. for about 3 to about 10 hours, for about 4 to about 6 hours, or for about 5 hours.

A translucent phosphor ceramic compact fabricated using one of the above methods may be useful in light-emitting devices. In some embodiments, the translucent phosphor ceramic compact used in such devices may be a YAG plate with a thickness of about 0.2 to about 1.5 mm. In other embodiments, a translucent ceramic compact may be a YAG plate with a thickness of about 1 mm and a transmittance of about 30% to about 50% at a wavelength of about 800 nm. In other embodiments, a translucent ceramic compact may be a YAG plate with a thickness of about 0.5 mm and a transmittance of about 50 to about 70% at a wavelength of about 800 nm.

The theoretical density of YAG is 4.55 g/cc. In those embodiments where a translucent ceramic compact used in a light-emitting device is YAG, the density may be around that value depending upon any dopants or other elements present in the plate. In some embodiments, a translucent phosphor ceramic compact may be a YAG plate with a density of about 4.4 to about 4.6 g/cc. In some embodiments, a translucent ceramic compact may be a YAG plate with a density of about 4.49 g/cc.

Another embodiment provides a light emitting device comprising a phosphor translucent ceramic compact. The light emitting device may be any device that emits light. In one embodiment, a light emitting device may be a light emitting diode (LED), an organic light emitting diode (OLED), or an inorganic electroluminescent device (IEL). Since the phosphor translucent ceramics disclosed herein may have high transparency and luminance efficiency, they may be useful when utilized as wavelength down converters for light emitting devices. A large variety of devices may be made which allow the light from the blue-LED to pass through the translucent phosphor ceramics, thus making the light appear more white.

In some embodiments, the phosphor translucent ceramics may be mounted into a blue-LED to yield a device that emits light that appears more white. FIG. 1 shows one of the examples of such a device's structure. In this device, the blue-LED 5 is fixed to a substrate 1, and the phosphor translucent ceramic compact 10 is positioned so that the blue-LED 5 is between the compact 10 and the substrate 1. The blue-LED 5 and compact 10 are encapsulated by a resin 15, which is attached to the substrate 1.

Figure 2:
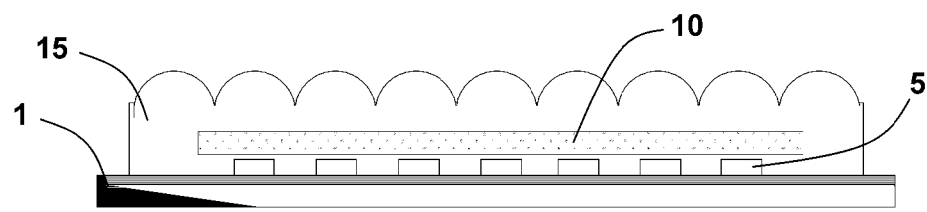
FIG. 2 is a schematic diagram of an alternate example of a device comprising a phosphor translucent ceramic compact disclosed herein.

In some embodiments, multiple LEDs may be incorporated in to a light emitting device. For example, one embodiment, illustrated in FIG. 2, has several blue-LEDs 5 which are fixed to the substrate 1. The phosphor translucent compact 10 in this embodiment is configured so that all of the blue-LEDs 5 are positioned between the substrate 1 and the compact 10. The blue-LEDs 5 and compact 10 are encapsulated by a resin 15, which is attached to the substrate 1.

Figure 3:
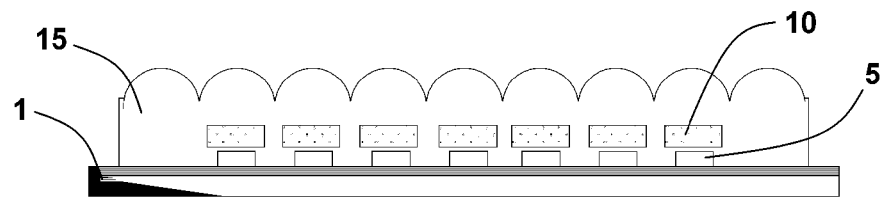
FIG. 3 is a schematic diagram of an alternate example of a device comprising phosphor translucent ceramic compacts disclosed herein.

In other embodiments, multiple emitting units comprising a blue-LED 5 and a phosphor translucent compact 10 are mounted on the substrate 1. For example, another embodiment illustrated in FIG. 3 has several blue-LEDs 5 fixed to the substrate 1. A multiplicity of the phosphor translucent compacts 10 are each positioned such that one blue-LED 5 is positioned between the substrate 1 and one of the compacts 10. The compacts 10 and the blue-LEDs 5 are encapsulated by the resin 15, which is attached to the substrate.

Figure 4:
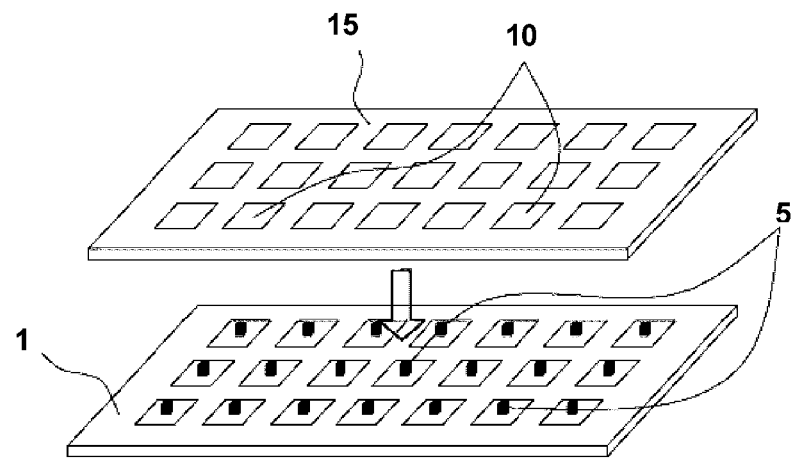
FIG. 4 shows another embodiment of a device comprising phosphor translucent ceramic compacts disclosed herein.

In some embodiments, array type emitting units may also be assembled to form a light emitting device. As depicted in FIG. 4, an array of blue-LEDs 5 is mounted on the substrate 1. A corresponding array of phosphor translucent ceramics plates 10 is formed by embedding the phosphor translucent ceramics plates in the encapsulant resin 15. The matching arrays of phosphor translucent ceramics plates and blue-LEDs are then combined to form a light emitting device that emits whiter light.

Although the depicted phosphor translucent ceramics compacts are flat plates, any shape and thickness of the compact may be utilized according to the design requirements.

Synthesis of a Cerium Doped Yttrium Aluminum Oxide Precursor Powder

Although many methods of preparing the materials or compositions disclosed herein may be apparent to those skilled in the art, the procedure below is one example of a method that may be used to prepare a precursor powder disclosed herein. Furthermore, although the example describes preparation of a cerium doped yttrium aluminum oxide powder, this method may be adapted to prepare the other precursor powders disclosed herein.

Yttrium (III) nitrate hexahydrate (99.9% pure, Sigma-Aldrich; 0.1497 mol; 57.337 g), Aluminum nitrate nonahydrate (99.97 pure, Sigma-Aldrich; 0.25 mol; 93.785 g), and of Cerium (III) nitrate hexahydrate (99.99 pure, Sigma-Aldrich; 0.0003 mol; 0.13 g) were dissolved in deionized water (1000 ml), followed by ultrasonication for 30 min to obtain a completely transparent solution.

This transparent solution was carried into a plasma reaction chamber via an atomization probe using a liquid pump. All deposition experiments were conducted with an RF induction plasma torch (TEKNA Plasma System, Inc PL-35) operating at 3.3 MHz. For the deposition experiments, the chamber pressure was maintained around 25 kPa-35 kPa, and the RF generator plate power was maintained in the range of 10-12 kW. Argon was introduced into the plasma torch as both the swirling sheath gas and the central plasma gas via the gas inlet ports. Sheath gas flow was maintained at 30 slm (standard liters per minute), while central gas flow was 10 slm.

Reactant injection was performed using a radial atomization probe (TEKNA Plasma System, Inc SDR-772). The probe was positioned at the center of the plasma plume during reactant injection. The reactants were fed into the plasma plume at a rate of 10 ml/min during deposition. Atomization of the liquid reactant was performed with Argon as atomizing gas delivered at a flow rate of 15 slm. Cooling water supply to the atomization probe was maintained at a flow rate of 4 slm and at 1.2 MPa pressure.

Preparation of a Pre-Conditioned Powder

Although many methods of preparing the materials or compositions disclosed herein may be apparent to those skilled in the art, the procedure below is one example of a method that may be used to prepare a pre-conditioned powder disclosed herein. The precursor powder prepared as described above was heated under an $N_2/H_2$ (97/3%) atmosphere at 1200° C. for 2 hrs to obtain the pre-conditioned powder.

Analysis of the Precursor Powder and the Pre-Conditioned Powder BET Analysis

BET is a measurement of the specific surface area of a material by utilizing the rule for physical adsorption of gas molecules on a solid surface (see S. Branauer, P. H. Emmitt and E. Teller J. Am. Chem. Soc. (1938) 60:309). BET surface areas of the yttrium aluminum oxide precursor powders and the pre-conditioned powders prepared as described above were measured by surface area analyzers (Gemini V, Micromeritics Instrument Corporation, Norcross Ga.) as summarized in Table 1. Assuming that the particle shape is spherical and that the density of YAG is 4.55 g/cc, the diameter of the YAG particles after annealing at 1200° C. in $N_2/H_2$ was in the range of 40~90 nm.

TABLE 1

BET Surface areas of precursor powder particles and pre-conditioned powder particles

| Ce-doping, CeY, % | BET, $m^2/g$ | |
| --- | --- | --- |
| | Precursor powder | Preconditioned powder |
| 0.267 | 137 ± 0 | 20.1 ± 0.1 |
| 0.440 | 30.2 ± 0.1 | 14.7 ± 0.2 |
| 0.549 | 135 ± 1 | 25.0 ± 0.3 |
| 0.606 | 149 ± 0 | 30.9 ± 0.3 |

Transmission Electron Microscopy (TEM) Analysis

The morphologies of the yttrium aluminum oxide precursor powder and the pre-conditioned powder prepared as described above were also observed by transmission electron microscopy using a JEOL 2200 field emission transmission electron microscopy (FETEM) with field emission filament at 200 kV accelerating voltage. The Particles were first dispersed in isopropanol by sonic bath, and then the particle/isopropanol solution was dropped on the lacey carbon grids to prepare TEM samples.

Figure 5A:
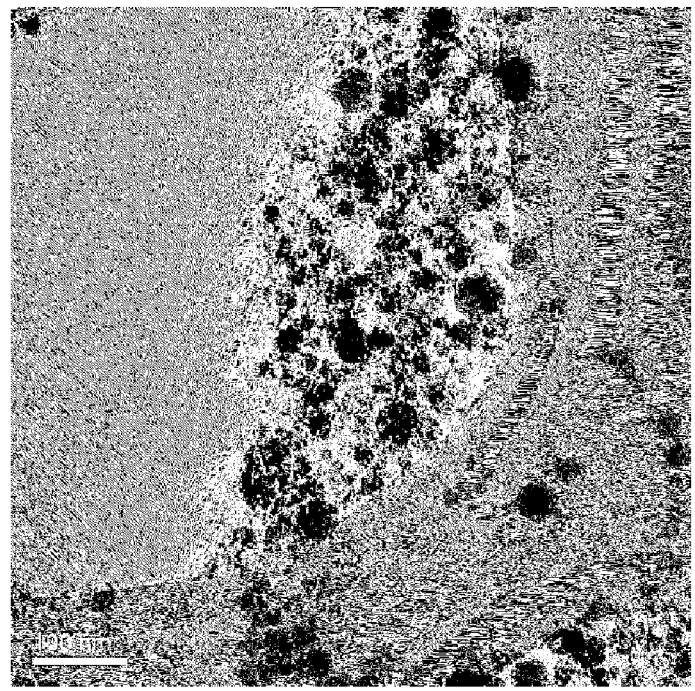
FIGS. 5A and 5B are TEM micrographs of one embodiment of an yttrium aluminum oxide precursor powder prepared as described herein.
Figure 5B:

FIGS. 5A and 5B show TEM micrographs of the yttrium aluminum oxide precursor powder prepared as described above. Although some particle sizes are approximately 40 nm in diameter, most of the particles are less than 20 nm and the average particle size appears to be less than 8 nm. High resolution (HR-) TEM micrograph in FIG. 5B shows amorphous structure of yttrium aluminum oxide particles. No YAG crystal structure was observed.

Figure 6A:
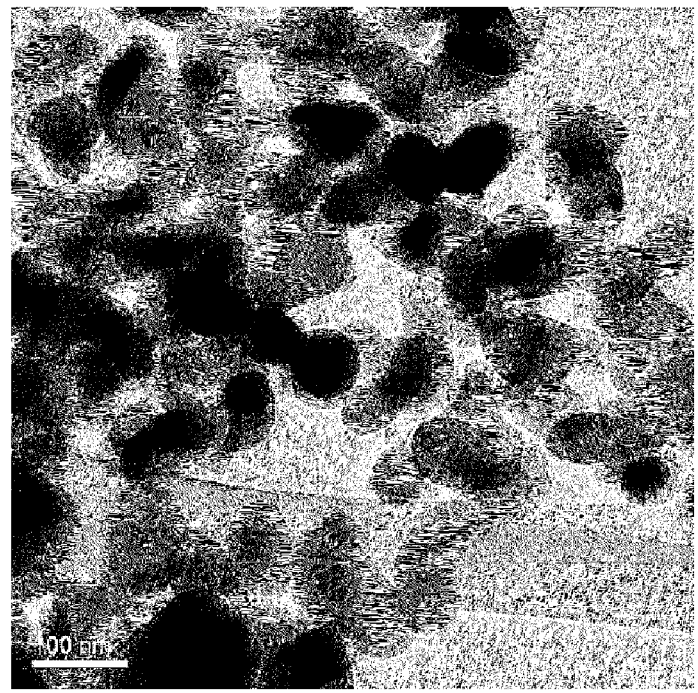
FIGS. 6A and 6B are TEM micrographs of one embodiment of an yttrium aluminum oxide pre-conditioned powder prepared as described herein.
Figure 6B:
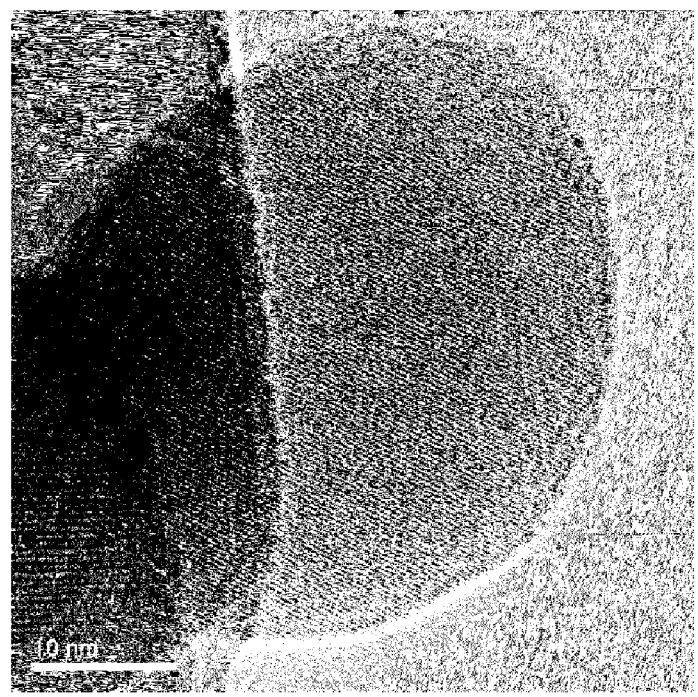

FIGS. 6A and 6B show TEM micrographs of yttrium aluminum oxide pre-conditioned powder. The yttrium aluminum oxide particles appear to have fused to each other and become physically attached during the heating process. A HR-TEM micrograph of the pre-conditioned powder in FIG. 6B shows clear crystal structure. No amorphous structure was observed.

X-Ray Diffraction (XRD) Analysis

The crystal structures of the yttrium aluminum oxide precursor powder and the pre-conditioned powder prepared as described above were characterized by X-ray diffraction (XRD) using a Rigaku Flex II diffraction system (Cu Kα radiation with λ=0.15418 nm) operating at 30 kV. The diffractogram step size was 0.2°, the count time was 1 sec/step, and the 2θ range was from 15-70°.

Figure 7:
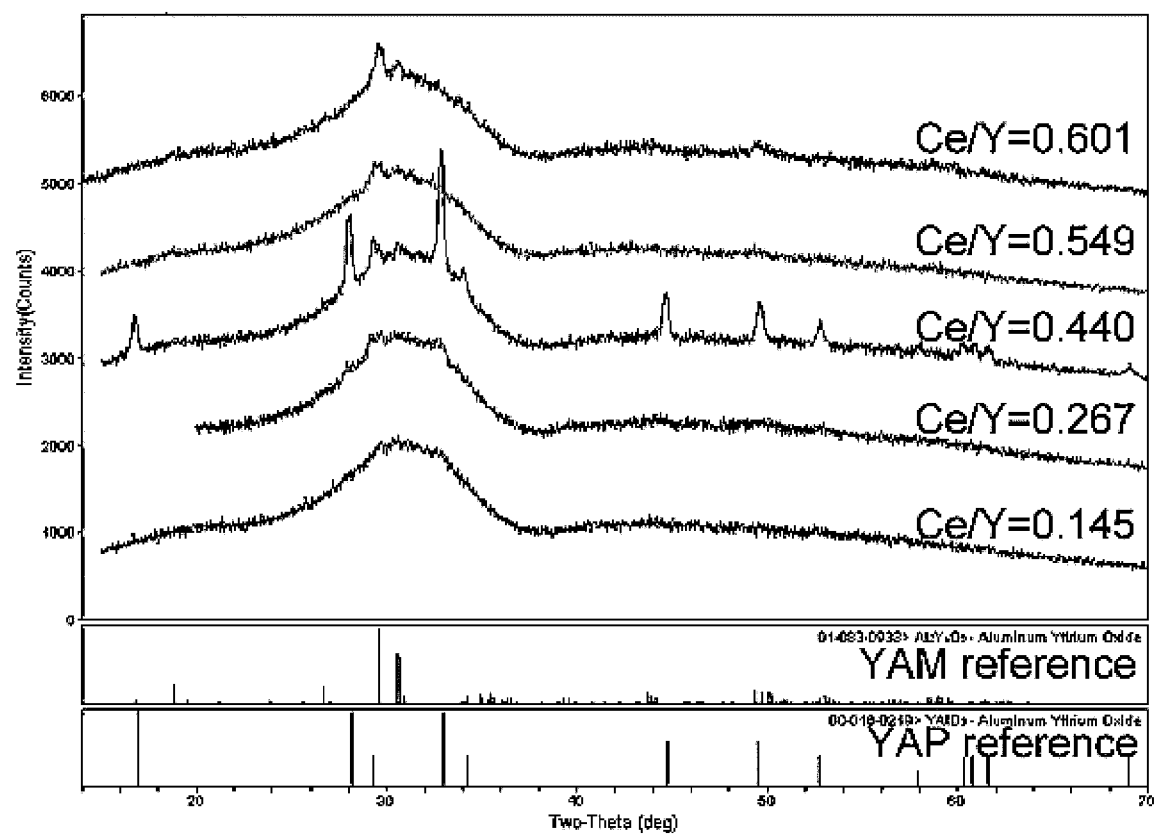
FIG. 7 shows XRD spectra of yttrium aluminum oxide particles with different Ce doping ratios.

FIG. 7 shows XRD spectra of yttrium aluminum oxide particles with different Ce doping ratios. The XRD spectra of the precursor powder prepared in a manner analogous to that described above is shown in FIG. 7. The broad peak at approximately 2θ=30° shows the predominance of amorphous phase for all particles, regardless of Ce doping ratio. Some of the particles may contain a YAP phase and some may contain a YAM phase.

Figure 8:
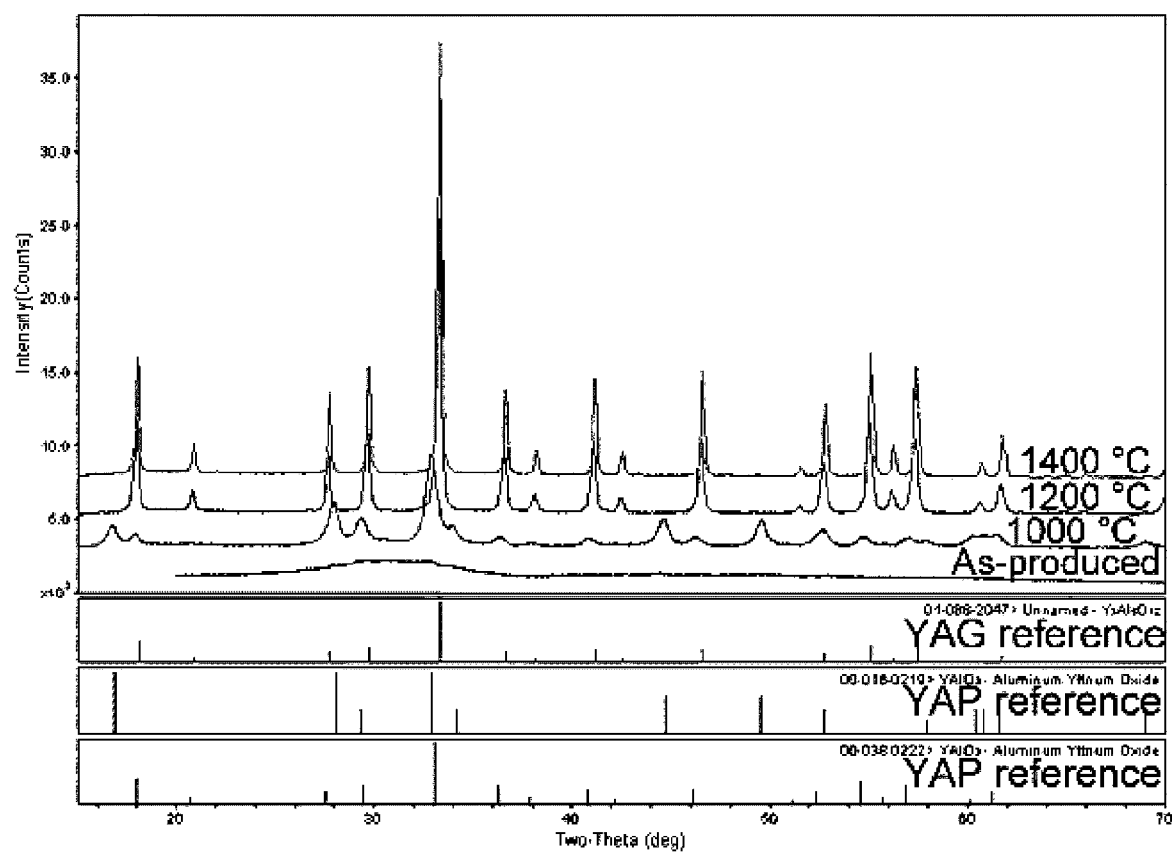
FIG. 8 shows XRD spectra of yttrium aluminum oxide pre-conditioned powders with a Ce/Y ratio of 0.267.

FIG. 8 shows XRD spectra of yttrium aluminum oxide pre-conditioned powders with a Ce/Y ratio of 0.267. In these experiments, the effect of the temperature at which the heating under a reducing atmosphere was investigated. Two samples were heated for 2 hrs with $N_2/H_2$ (97%/3%). One sample was maintained at about 1000° C. and the other at about 1200° C. XRD spectra showed that the phase of the pre-conditioned powder which had been heated at 1000° C. had been converted from the amorphous phase as the precursor powder to the YAP phase as the pre-conditioned powder. The phase of the pre-conditioned powder which had been heated at 1200° C. had been converted from the amorphous phase as the precursor powder to the YAG phase as the pre-conditioned powder.

Differential thermal analysis (DTA) was conducted using TA Instruments Q600 simultaneous thermogravimetric and differential thermal analysis (SDT). Samples of the yttrium aluminum oxide preconditioned powder (5-15 mg) were tested to measure temperature difference ΔT in order to detect phase changes of yttrium aluminum oxide particles in nitrogen purge. These samples were ramped from ambient to 1500° C. at 20° C./min with purging $N_2$. A peak at approximately 950° C. indicated a phase change from amorphous to YAP, and a second peak at approximately 1100° C. indicated a phase change from YAP to YAG phases, respectively.

EXAMPLE 1

A YAG translucent ceramic compact plate was processed using a pre-conditioned powder prepared as described above with Ce-doping ratio of Ce/Y=0.267 and heated in a $N_2/H_2$ atmosphere at 1200° C. for 2 hrs. The mixture of preconditioned powder, 5 wt. % of poly(vinyl butyral-co vinyl alcohol-co vinyl acetate) (PVB, Sigma-Aldrich, Mw=90000~120000), and 3000 wt. ppm fumed silica nanoparticles (MH-5, Cabot Corporation) were first sonicated in methanol for 20 min. using a sonicator (XL-2000, Misonix Inc, Farmingdale N.Y.). After completely removing ethanol, the dried powders were gently grinded using mortar and pestle. The disc compacts of 12 mm diameter were molded from either 200 mg or 400 mg mixed powders by applying the compression force of approximately 10 tf at room temperature. The compacts were heated in a high purity alumina tube of 82 mm outer diameter attached to a tube furnace (GSL 1700X, MTI Corporation, Richmond Calif.) heated by a $MoSi_2$ element. Heating intermediate compacts having masses of 200 mg and 400 mg yielded approximately 0.5 mm and 1.0 mm thick YAG translucent ceramic compact plates (Samples 1b and 1a, respectively). The heating rate was 4.0° C./min and the intermediate compacts were maintained at 1500° C. for 5 hrs under vacuum by a mechanical vacuum pump. The densities of the obtained YAG translucent ceramic compact plates were measured with de-ionized water by Archimedes' method.

The total transmittance (Tt %) of the obtained YAG translucent ceramic compact plates were measured by high sensitivity multi channel photo detector (MCPD 7000, Otsuka Electronics, Inc). First, a glass plate was irradiated with monochromatic blue light with peak wavelength of 460 nm to obtain the reference data. Then, a YAG ceramic plate placed on the reference glass was also irradiated with monochromatic blue light with peak wavelength of about 460 nm. Luminance spectrum was acquired by photo detector (MCPD) for each sample. In this measurement, the YAG plate on the glass plate was coated with paraffin oil having the same refractive index as the glass plate. Tt % at 800 nm wavelength of light was used to as a quantitative measurement of transparency of the YAG ceramics plates. The experimental conditions and the experimental data are summarized in Table 2.

Tt % of the 1.0 mm thick YAG translucent ceramic compact plate (Sample 1a) was 42.7%, and the Tt % of the 0.5 mm thick YAG translucent ceramic compact plate (Sample 1b) was 63.6%. The density of the two plates was 4.49 g/cc. Since the theoretical density of YAG is 4.55 g/cc, these YAG translucent ceramic compact plates may be considered to be of high density.

EXAMPLE 2

The procedure of Example 1 was repeated except that 4.0% TEOS was used as a sintering aid instead of 3000 wtppm $SiO_2$ to make Sample 2. The results are reported in Table 2.

EXAMPLE 3

The procedure of Example 1 was repeated except that the intermediate compact was heated at 1500° C. for 50 hrs under vacuum. Tt % of the resultant 0.5 mm thick YAG translucent ceramic compact plate (Sample 3) was 61.4%. The density of the plate was 4.45 g/cc. Therefore, a YAG translucent ceramic compact plate with high density was obtained.

EXAMPLE 4

The procedure of Example 1 was repeated except that the intermediate compact was heated at 1600° C. for 5 hrs under vacuum. Tt % of the resultant 0.5 mm thick YAG translucent ceramic compact plate (Sample 4) was 61.6%. The density of the plates was 4.61 g/cc. Therefore, a YAG translucent ceramic compact plate with high density was obtained.

EXAMPLE 5

The procedure of Example 4 was repeated except that 4.0% TEOS was used as a sintering aid instead of 3000 wtppm $SiO_2$ to make Sample 5. The results are reported in Table 2.

EXAMPLE 6

The procedure of Example 1 was repeated except that the intermediate compact was heated at 1600° C. for 4 hrs, the temperature was then increased to 1700° C. at a rate of 3° C./min, and the sample was maintained at 1700° C. for 30 minutes, all under vacuum. Tt % of the resultant 0.5 mm thick YAG translucent ceramic compact plate was 47.7%. The density of the plates was 4.48 g/cc. Therefore, a YAG translucent ceramic compact plate with high density was obtained.

EXAMPLE 7

The procedure of Example 1 was repeated except that the precursor powder was heated in air at 1200° C. for 2 hrs, and then heated under $N_2/H_2$ at 1200° C. for 2 hrs to provide the pre-conditioned powder. All other conditions were the same as Example 1. Tt % of the resultant 0.5 mm thick YAG translucent ceramic compact plate was 67.3%. The density of the plates was 4.51 g/cc. Therefore, a YAG translucent ceramic compact plate with high density was obtained.

EXAMPLE 8

The procedure of Example 7 was repeated except that the intermediate compact was heated at 1600° C. for 5 hrs under vacuum. Tt % of the resultant 0.5 mm thick YAG translucent ceramic compact plate was 74.8%. The density of the plates was 4.49 g/cc. Therefore, a YAG translucent ceramic compact plate with high density was obtained.

COMPARATIVE EXAMPLE 1

The procedure of Example 1 was repeated except that the sample was annealed at 1000° C. The results are reported in Table 2.

COMPARATIVE EXAMPLE 2

The procedure of Example 1 was repeated except that no sintering aid was used. The results are reported in Table 2.

COMPARATIVE EXAMPLE 3

The procedure of Example 1 was repeated except that the sample was annealed at 1400° C. The results are reported in Table 2.

COMPARATIVE EXAMPLE 4

The procedure of Example 1 was repeated except that the intermediate compact was heated at 1300° C. for 5 hrs under vacuum. Tt % of the resultant 0.5 mm thick YAG ceramic compact plate (Comp 4) was only 15.7%. Therefore, the plate was not translucent. The density of the plates was 4.31 g/cc.

COMPARATIVE EXAMPLE 5

The procedure of Example 1 was repeated except that the intermediate compact was heated at 1400° C. for 5 hrs under vacuum. Tt % of a resultant 0.5 mm thick YAG translucent ceramic compact plate (Comp 5b) was 41.9% and Tt % of a the resultant 1 mm thick YAG translucent ceramic compact plate (Comp 5a) was 24.0%. The density of the plates was 4.44 g/cc.

COMPARATIVE EXAMPLE 6

The procedure of Comparative Example 4 was repeated except that the precursor powder was heated in air at 1200° C. for 2 hrs to provide a substitute for the pre-conditioned powder. All other conditions were the same as Example 1. Tt % of the resultant 0.5 mm thick YAG ceramic compact plate (Comp 6) was only 2.08%. The density of the plates was 4.31 g/cc.

COMPARATIVE EXAMPLE 7

The procedure of Comparative Example 6 was repeated except that the intermediate compact was heated under vacuum at 1400° C. for 5 hrs. Tt % of the resultant 0.5 mm thick YAG translucent ceramic compact plate (Comp 7) was only 5.63%. The density of the plates was 4.36 g/cc.

COMPARATIVE EXAMPLE 8

The procedure of Comparative Example 6 was repeated except that the intermediate compact was heated under vacuum at 1500° C. for 5 hrs. Tt % of a resultant 0.5 mm thick YAG translucent ceramic compact plate (Comp 8a) was 8.60% and Tt % of a the resultant 1 mm thick YAG translucent ceramic compact plate (Comp 8b) was 6.89%. The density of the plates was 4.37 g/cc.

COMPARATIVE EXAMPLE 9

The procedure of Comparative Example 6 was repeated except that the intermediate compact was heated at 1600° C. for 5 hrs under vacuum. Tt % of the resultant 0.5 mm thick YAG translucent ceramic compact plate (Comp 9) was 34.5%. The density of the plates was 4.43 g/cc.

EXAMPLE 9

The procedure of Example 1 was repeated on a precursor powder with a Ce-doping ratio of Ce/Y=0.440. Tt % of a resultant 0.5 mm thick YAG translucent ceramic compact plate (Sample 9a) was 31.3% and Tt % of a the resultant 1 mm thick YAG translucent ceramic compact plate (Sample 9b) was 41.4%. The density of the plates was 4.46 g/cc. Therefore, YAG translucent ceramic compact plates with high density were obtained.

EXAMPLE 10

The procedure of Example 9 was repeated except that the intermediate compact was heated at 1500° C. for 50 hrs under vacuum. Tt % of the resultant 0.5 mm thick YAG translucent ceramic compact plate (Sample 10) was 40.2%. The density of the plates was 4.39 g/cc. Therefore, a YAG translucent ceramic compact plate with high density was obtained.

COMPARATIVE EXAMPLE 10

The procedure of Example 9 was repeated except that the precursor powder was not heated under a reducing atmosphere. Tt % of a resultant 0.5 mm thick YAG translucent ceramic compact plate (Comp 10a) was 5.36% and Tt % of a the resultant 1 mm thick YAG translucent ceramic compact plate (Comp 10b) was 21.6%. Therefore, the plates were not translucent because the precursor powder was not heated under a reducing atmosphere. The density of the plates was 4.33 g/cc.

EXAMPLE 11

The procedure of Example 1 was repeated on a precursor powder with a Ce-doping ratio of Ce/Y=0.549. Tt % of a resultant 0.5 mm thick YAG translucent ceramic compact plate (Sample 11a) was 36.2% and Tt % of a the resultant 1 mm thick YAG translucent ceramic compact plate (Sample 11b) was 25.0%. The density of the plates was 4.40 g/cc. Therefore, YAG translucent ceramic compact plates with high density were obtained.

EXAMPLE 12

The procedure of Example 11 was repeated except that the intermediate compact was heated at 1500° C. for 50 hrs under vacuum. Tt % of the resultant 0.5 mm thick YAG translucent ceramic compact plate was 41.4%. The density of the plates was 4.43 g/cc. Therefore, a YAG translucent ceramic compact plate with high density was obtained.

EXAMPLE 13

The procedure of Example 1 was repeated on a precursor powder with a Ce-doping ratio of Ce/Y=0.601. Tt % of the resultant 1 mm thick YAG translucent ceramic compact plate (Sample 13) was 21.9%. The density of the plates was 4.35 g/cc. Therefore, YAG translucent ceramic compact plates with high density were obtained.

EXAMPLE 14

The procedure of Example 13 was repeated except that the intermediate compact was heated at 1500° C. for 50 hrs under vacuum. Tt % of the resultant 0.5 mm thick YAG translucent ceramic compact plate (Sample 14) was 33.9%. The density of the plates was 4.37 g/cc. Therefore, a YAG translucent ceramic compact plate with high density was obtained.

EXAMPLE 15

A YAG translucent ceramic compact plate was processed using a pre-conditioned powder prepared as described above with Ce-doping ratio of Ce/Y=0.145 and heated in a $N_2/H_2$ atmosphere at 1200° C. for 2 hrs. The mixture of preconditioned powder, 5 wt. % of poly(vinyl butyral-co vinyl alcohol-co vinyl acetate) (PVB, Sigma-Aldrich, Mw=90000~120000), and 4.0 wt % tetraethyl orthosilicate (TEOS) (Sigma Aldrich) were ball-milled using a planetary ball mill (Fritsch, Germany) in ethanol for more than 15 hrs using zirconia balls having 3 mm diameter. TEOS is converted into silica nanoparticles by the hydrolysis reaction with the existence of water in ethanol. After completely removing ethanol, the dried powders were gently grinded using mortar and pestle. The disc compacts of 12 mm diameter were molded from either 200 mg or 400 mg mixed powders by applying the compression force of approximately 10 tf at room temperature. The compacts were heated in a high purity alumina tube of 82 mm outer diameter attached to a tube furnace (GSL 1700X, MTI Corporation, Richmond Calif.) heated by a $MoSi_2$ element. Heating intermediate compacts having masses of 200 mg yielded approximately 0.5 mm thick YAG translucent ceramic compact plates. The heating rate was 4.0° C./min and the intermediate compacts were maintained at 1500° C. for 5 hrs under vacuum by a mechanical vacuum pump. The density of the obtained YAG translucent ceramic compact plate was measured with deionized water by Archimedes' method.

Tt % of the 0.5 mm thick YAG translucent ceramic compact plate (Sample 15) was 53.7%. The density of the plate was 4.49 g/cc. Since the theoretical density of YAG is 4.55 g/cc, these YAG translucent ceramic compact plates may be considered to be of high density.

EXAMPLE 16

The procedure of Example 15 was repeated except that 1.0 wt % TEOS was used as a sintering aid, and the sintering temperature was 1600° C. The results are presented in Table 2.

EXAMPLE 17

The procedure of Example 15 was repeated except that 2.0 wt % TEOS was used as a sintering aid, and the sintering temperature was 1600° C. The results are presented in Table 2.

EXAMPLE 18

The procedure of Example 15 was repeated except that the sintering temperature was 1600° C. The results are presented in Table 2.

COMPARATIVE EXAMPLE 11

The procedure of Example 15 was repeated except that no TEOS was used and the sintering temperature was 1600° C. The results are presented in Table 2.

TABLE 2

Summary of examples and comparative examples.

| Samples | Ce/Y, % | Annealing temperature, °C | Annealing atmosphere | Sintering aid | Sintering temperature, °C | Sintering time | Density, g/cc | Tt % at 800 nm | Plate thickness, mm |
|---|---|---|---|---|---|---|---|---|---|
| 1a | 0.267 | 1200° C. | $N_2/H_2$ | 3000 wtppm $SiO_2$ | 1500° C. | 5 hrs | 4.49 | 63.6 | 0.573 |
| 1b | 0.267 | 1200° C. | $N_2/H_2$ | 3000 wtppm $SiO_2$ | 1500° C. | 5 hrs | 4.49 | 42.7 | 0.966 |
| 2 | 0.267 | 1200° C. | $N_2/H_2$ | 4.0 wt % TEOS | 1500° C. | 5 hrs | 4.45 | 66.7 | 0.547 |
| 3 | 0.267 | 1200° C. | $N_2/H_2$ | 3000 wtppm $SiO_2$ | 1500° C. | 50 hrs | 4.45 | 61.4 | 0.516 |
| 4 | 0.267 | 1200° C. | $N_2/H_2$ | 3000 wtppm $SiO_2$ | 1600° C. | 5 hrs | 4.61 | 61.6 | 0.500 |
| 5 | 0.267 | 1200° C. | $N_2/H_2$ | 4.0 wt % TEOS | 1600° C. | 5 hrs | 4.47 | 73.4 | 0.571 |
| 6 | 0.267 | 1200° C. | $N_2/H_2$ | 3000 wtppm $SiO_2$ | 1600° C./1700° C. | 4 hrs/0.5 hr | 4.48 | 47.7 | 0.528 |
| 7 | 0.267 | 1200° C. | Air→$N_2/H_2$ | 3000 wtppm $SiO_2$ | 1500° C. | 5 hrs | 4.51 | 67.3 | 0.481 |
| 8 | 0.267 | 1200° C. | Air→$N_2/H_2$ | 3000 wtppm $SiO_2$ | 1600° C. | 5 hrs | 4.49 | 74.8 | 0.557 |
| Comp 1 | 0.267 | 1000° C. | $N_2/H_2$ | 3000 wtppm $SiO_2$ | 1500° C. | 5 hrs | 4.46 | 36.6 | 1.16 |
| Comp 2 | 0.267 | 1200° C. | $N_2/H_2$ | 0.0% TEOS ($SiO_2$) | 1500° C. | 5 hrs | 4.35 | 17.7 | 1.09 |
| Comp 3 | 0.267 | 1400° C. | $N_2/H_2$ | 3000 wtppm $SiO_2$ | 1500° C. | 5 hrs | 4.24 | 10.2 | 1.01 |
| Comp 4 | 0.267 | 1200° C. | $N_2/H_2$ | 3000 wtppm $SiO_2$ | 1300° C. | 5 hrs | 4.31 | 15.7 | 0.511 |
| Comp 5a | 0.267 | 1200° C. | $N_2/H_2$ | 3000 wtppm $SiO_2$ | 1400° C. | 5 hrs | 4.44 | 41.9 | 0.574 |
| Comp 5b | 0.267 | 1200° C. | $N_2/H_2$ | 3000 wtppm $SiO_2$ | 1400° C. | 5 hrs | 4.44 | 24 | 1.12 |
| Comp 6 | 0.267 | 1200° C. | Air | 3000 wtppm $SiO_2$ | 1300° C. | 5 hrs | 4.31 | 2.08 | 0.637 |
| Comp 7 | 0.267 | 1200° C. | Air | 3000 wtppm $SiO_2$ | 1400° C. | 5 hrs | 4.36 | 5.63 | 0.582 |
| Comp 8a | 0.267 | 1200° C. | Air | 3000 wtppm $SiO_2$ | 1500° C. | 5 hrs | 4.37 | 8.6 | 0.577 |
| Comp 8b | 0.267 | 1200° C. | Air | 3000 wtppm $SiO_2$ | 1500° C. | 5 hrs | 4.37 | 6.89 | 1.01 |
| Comp 9 | 0.267 | 1200° C. | Air | 3000 wtppm $SiO_2$ | 1600° C. | 5 hrs | 4.43 | 34.5 | 0.559 |
| 9a | 0.440 | 1200° C. | Air | 3000 wtppm $SiO_2$ | 1500° C. | 5 hrs | 4.46 | 41.4 | 0.541 |
| 9b | 0.440 | 1200° C. | Air | 3000 wtppm $SiO_2$ | 1500° C. | 5 hrs | 4.46 | 31.3 | 0.997 |
| 10 | 0.440 | 1200° C. | Air | 3000 wtppm $SiO_2$ | 1500° C. | 50 hrs | 4.39 | 40.2 | 0.529 |
| Comp 10a | 0.440 | N/A | N/A | 3000 wtppm $SiO_2$ | 1500° C. | 5 hrs | 4.33 | 21.6 | 0.512 |
| Comp 10b | 0.440 | N/A | N/A | 3000 wtppm $SiO_2$ | 1500° C. | 5 hrs | 4.33 | 5.36 | 1.25 |
| 11a | 0.549 | 1200° C. | $N_2/H_2$ | 3000 wtppm $SiO_2$ | 1500° C. | 5 hrs | 4.4 | 36.2 | 0.555 |
| 11b | 0.549 | 1200° C. | $N_2/H_2$ | 3000 wtppm $SiO_2$ | 1500° C. | 5 hrs | 4.4 | 25 | 1.00 |
| 12 | 0.549 | 1200° C. | $N_2/H_2$ | 3000 wtppm $SiO_2$ | 1500° C. | 50 hrs | 4.43 | 41.4 | 0.535 |
| 13 | 0.601 | 1200° C. | $N_2/H_2$ | 3000 wtppm $SiO_2$ | 1500° C. | 5 hrs | 4.35 | 21.9 | 0.986 |
| 14 | 0.601 | 1200° C. | $N_2/H_2$ | 3000 wtppm $SiO_2$ | 1500° C. | 50 hrs | 4.37 | 33.9 | 0.49 |
| 15 | 0.145 | 1200° C. | $N_2/H_2$ | 4.0 wt % TEOS | 1500° C. | 5 hrs | 4.49 | 53.7 | 0.572 |
| 16 | 0.145 | 1200° C. | $N_2/H_2$ | 1.0 wt % TEOS | 1600° C. | 5 hrs | 4.37 | 45.4 | 0.547 |
| 17 | 0.145 | 1200° C. | $N_2/H_2$ | 2.0 wt % TEOS | 1600° C. | 5 hrs | 4.32 | 52.3 | 0.526 |

TABLE 2-continued

Summary of examples and comparative examples.

| Samples | Ce/Y, % | Annealing temperature, °C. | Annealing atmosphere | Sintering aid | Sintering temperature, °C. | Sintering time | Density, g/cc | Tt % at 800 nm | Plate thickness, mm |
|---|---|---|---|---|---|---|---|---|---|
| 18 | 0.145 | 1200° C. | $N_2/H_2$ | 4.0 wt % TEOS | 1600° C. | 5 hrs | 4.25 | 58.9 | 0.548 |
| Comp 11 | 0.145 | 1200° C. | $N_2/H_2$ | 0.0% TEOS ($SiO_2$) | 1600° C. | 5 hrs | 4.34 | 31.7 | 0.597 |

What is claimed is:

1. A method for fabricating a cerium doped translucent phosphor ceramic compact comprising:
   heating a precursor powder comprising yttrium, aluminum, oxygen, and cerium sources to a temperature of from about 1000° C. to about 1350° C. under a reducing atmosphere to provide a pre-conditioned powder;
   forming an intermediate compact comprising the pre-conditioned powder and a flux material; and
   heating the intermediate compact under a vacuum at a temperature of from about 1400° C. to about 1800° C.

2. The method of claim 1, further comprising heating the precursor powder under air at about 1000° C. to about 1350° C. prior to heating under a reducing atmosphere.

3. The method of claim 1 wherein the intermediate compact further comprises a binder.

4. The method of claim 3, wherein the binder is a polymer binder.

5. The method of claim 1 wherein the heating the intermediate compact under a vacuum is at a temperature from about 1500° C. to about 1700° C.

6. The method of claim 1 wherein the precursor powder has a cerium to yttrium molar ratio of about 0.0002 to about 0.02.

7. The method of claim 1 wherein the precursor powder has a cerium to yttrium molar ratio of about 0.00025 to about 0.0065.

8. A method for fabricating a translucent phosphor ceramic compact comprising:
   heating a precursor powder to at least about 1000° C. under a reducing atmosphere to provide a pre-conditioned powder;
   forming an intermediate compact comprising the pre-conditioned powder and a flux material; and
   heating the intermediate compact under a vacuum to a temperature of at least about 1400° C.

9. The method of claim 8, wherein the precursor powder is heated to a temperature of about 1000° C. to about 1400° C.

10. The method of claim 8, wherein the precursor powder is heated to a temperature of about 1100° C. to about 1300° C.

11. The method of claim 8, wherein the intermediate compact is heated to a temperature of about 1400° C. to about 1900° C.

12. The method of claim 8, wherein the intermediate compact is heated to a temperature of about 1500° C. to about 1700° C.

13. The method of claim 8, wherein the reducing atmosphere comprises a mixture of at least one inert gas and hydrogen.

14. The method of claim 13, wherein the inert gas is argon or nitrogen.

15. The method of claim 13, wherein the reducing atmosphere comprises about 1% to about 10% by volume of hydrogen gas in nitrogen gas.

16. The method of claim 8, wherein the precursor powder comprises one or more of: amorphous yttrium oxide, yttrium aluminum perovskite, and yttrium aluminum monoclinic.

17. The method of claim 8, wherein the pre-conditioned powder comprises yttrium aluminum garnet.

18. The method of claim 8, wherein the intermediate compact further comprises a binder.

19. The method of claim 18, wherein the binder is a polymer binder.

20. The method of claim 8, wherein said translucent phosphor ceramic compact comprises a rare earth doped phosphor material having garnet structure.

21. The method of claim 8, wherein said translucent phosphor ceramic compact comprises a composition of $(A_{1-x}E_x)_3B_5O_{12}$, wherein
   A is Y, Gd, La, Lu, Tb, or a combination thereof;
   x is from about 0.00005 to about 0.1;
   B is Al, Ga, In, or a combination thereof; and
   E is Ce, Eu, Tb, Nd, or a combination thereof.

* * * * *